(12) United States Patent
Hays et al.

(10) Patent No.: US 6,674,220 B2
(45) Date of Patent: Jan. 6, 2004

(54) TEMPERATURE-COMPENSATED PIEZOELECTRIC FORCE MOTOR

(75) Inventors: Paul B. Hays, Ann Arbor, MI (US); Greg Ritter, Hamburg, MI (US)

(73) Assignee: Michigan Aerospace Corp., Ann Arbor, MI (US)

( * ) Notice: Subject to any disclaimer, the term of this patent is extended or adjusted under 35 U.S.C. 154(b) by 0 days.

(21) Appl. No.: 10/076,165

(22) Filed: Feb. 14, 2002

(65) Prior Publication Data
US 2002/0113524 A1 Aug. 22, 2002

Related U.S. Application Data

(60) Provisional application No. 60/268,789, filed on Feb. 14, 2001.

(51) Int. Cl.[7] .............................................. H01L 41/08
(52) U.S. Cl. .................................................... 310/346
(58) Field of Search ........................................ 310/346

(56) References Cited

U.S. PATENT DOCUMENTS

| | | | | |
|---|---|---|---|---|
| 3,349,259 A | * | 10/1967 | Kistler | 29/595 |
| 3,524,196 A | * | 8/1970 | Church et al. | 310/328 |
| 3,590,287 A | * | 6/1971 | Berlincourt et al. | 310/321 |
| 3,943,389 A | * | 3/1976 | Hickernell et al. | 310/313 A |
| 5,222,713 A | * | 6/1993 | Lawless et al. | 138/45 |
| 5,936,150 A | * | 8/1999 | Kobrin et al. | 310/324 |
| 6,246,157 B1 | * | 6/2001 | Oliver et al. | 310/328 |
| 6,310,424 B1 | * | 10/2001 | Ogura et al. | 310/313 A |

FOREIGN PATENT DOCUMENTS

| | | | | |
|---|---|---|---|---|
| JP | 2-197180 | * | 8/1990 | 310/341 |
| JP | 4-17579 | * | 1/1992 | 310/365 |

* cited by examiner

*Primary Examiner*—Thomas M. Dougherty
(74) *Attorney, Agent, or Firm*—Gifford, Krass, Groh, Sprinkle, Anderson & Citkowski, PC

(57) ABSTRACT

An improved, temperature-compensated piezoelectric force motor features greater dynamic range and robustness as compared to previous motor designs. By implementing positive and negative expanding elements, the overall motor length is held constant over temperature. A central stretching member removes the PZT element from the load path of the motor when the motor is relaxed, thereby preventing damage to the element during assembly and deployment. When the piezoelectric element is powered, the central structural member also improves the failure strength of the assembly to further increase the robustness of the motor design. The invention finds applicability in various commercial products including, but not limited to, scientific etalons, nanopositioning systems, custom fiber optic assemblies, and custom CCD detectors.

4 Claims, 4 Drawing Sheets

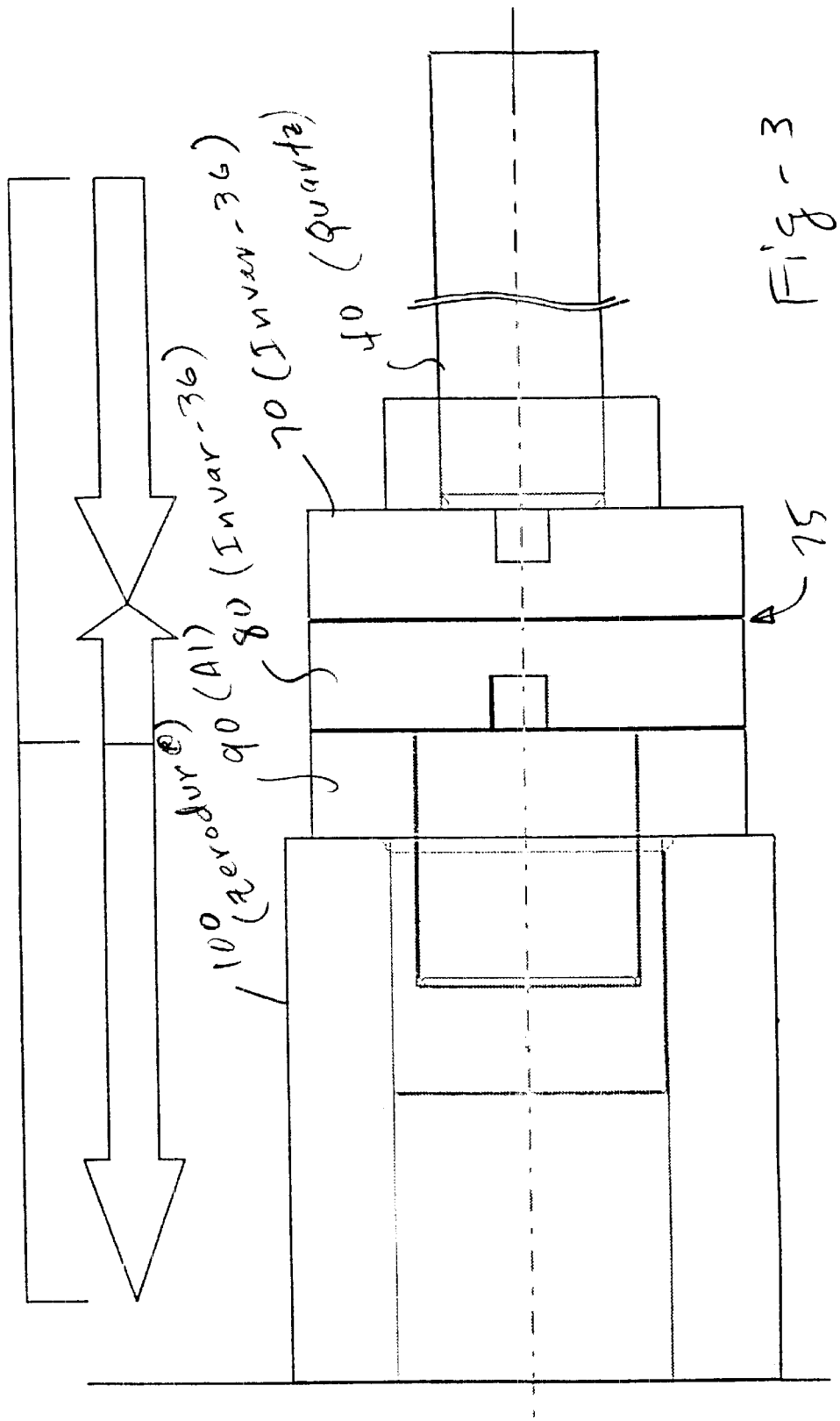

TEMPERATURE-COMPENSATED PIEZOELECTRIC FORCE MOTOR

REFERENCE TO RELATED APPLICATION

This application claims priority from U.S. provisional patent application Serial No. 60/268,789, filed Feb. 14, 2001, the entire contents of which is incorporated herein.

FIELD OF THE INVENTION

This invention related generally to piezoelectric actuation and, in particular, to an improved piezoelectric force motor incorporating a stacked transducer and other features to achieve a temperature expansion coefficient that approaches zero.

BACKGROUND OF THE INVENTION

While there are many types of electrical motors capable of delivering rotational force, the choices for linear translation are more limited. One option is the ball-and-screw type motor, which incorporates a threaded shaft and a metal ball with a threaded hole that mates with the threaded shaft. As the shaft turns, the metal ball rides up or down the shaft to linearly displace the metal ball and any attached mechanism. The problems with this approach include high manufacturing tolerances and mechanical wear, which can lead to unacceptable positioning accuracy and premature failure.

An alternative is linear actuators and force motors based upon the piezoelectric effect. Certain piezoelectric materials are able to convert electrical energy directly into mechanical energy. When a voltage is applied, the material will experience a strain that causes it to expand. When the voltage is removed, the strain is removed and the material contracts.

Piezoelectric materials are generally formed from ceramics, and may include a plurality of laminated layers to keep the drive voltage to a practical level while delivering significant expansion. To increase power output, however, it is often necessary to use multiple or split shafts. One example is described in U.S. Pat. No. 6,246,157, which includes a split motor shaft having with two shaft segments that are coaxially affixed to opposite sides of an expandable and contractable displacement actuator. The displacement actuator has a piezoelectric body coincident with the axis of the shaft segments such that the expansion of the piezoelectric body increases the length of the split shaft. The motor has a set of clamps that receive and close on the shaft segments to hold them in place, or open to allow axial displacement of the shaft segments. Linear motion of the split shaft motor is produced by coordinating the opening and closing of the clamps with the expansion and contraction of the piezoelectric body.

Other applications may require less force, but may need to be very accurate over a particular temperature range. One example is the air-gapped tunable etalon developed for various spectroscopic environmental monitoring applications. Although the actuators used for tuning, i.e., the motors, worked exceptionally well, they were not designed to be produced as a commercial product. Generally speaking, these previous designs required too much manual labor and craftsmanship to produce them in an appreciable quantity.

The previous motors were also optically contacted to the etalon plates, such that when the length of the motors was changed, a bending moment was exerted on the etalon plate, resulting in an over-constrained system. This limited the versatility that could be achieved with the approach, since etalon defect finesse is usually the limiting factor in achieving high-finesse in a Fabry-Perot etalon.

The first generation of motors also had a limited dynamic range, since they used single-element piezoelectric elements. The nominal capacitance in the feedback system also varied greatly, requiring the controllers to be matched to the motors. This, in turn, caused a variation in the sensitivity from motor to motor, which impacted the quality of the product. Such motors, like those commercially available from other vendors, are not capable of sustaining a bending moment. Any application of a bending moment results in failure of the piezoelectric element which permanently damages the motor. This requires that the assembly into which the motors will be integrated to either be designed such that bending moments cannot be applied, or it must be machined with sufficiently high precision so that when it is assembled, bending is eliminated. Both of these remedies result in a mechanism that is more complex and expensive than what would be required if the motor were capable of enduring a bending load.

Thus while this and other relatively low-volume applications may be served with engineering-intensive designs, there is an outstanding need for a piezoelectric force motor that will be competitive with existing commercial products not only in terms of price, but also in terms of robustness and dynamic range, particularly if such applications lead to a need for higher volumes.

SUMMARY OF THE INVENTION

This invention resides in an improved, temperature-compensated piezoelectric force motor featuring greater dynamic range and robustness as compared to previous motor designs. By implementing positive and negative expanding elements, the overall motor length can be held constant over temperature, thereby achieving a temperature expansion coefficient that approaches zero.

The inventive device is based upon a stacked PZT transducer wherein a central structural member is stretched to increase its rigidity and robustness. This central stretching removes the PZT element from the load path of the motor when the motor is relaxed, thereby preventing damage to the element during assembly (and during launch with respect to space-borne applications). When the piezoelectric element is powered, this central structural member also improves the failure strength of the assembly to further increase the robustness of the motor design.

The invention also has the advantage that the capacitance of the feedback system can be changed after the motor has been assembled. This allows the nominal capacitance to be optimized and standardized for the nominal controller capacitance. This improves the manufacturability in that this is no longer a single point failure mechanism in the assembly.

The invention finds applicability in various commercial products including, but not limited to, scientific etalons, nanopositioning systems, custom fiber optic assemblies, and custom CCD detectors.

BRIEF DESCRIPTION OF THE DRAWINGS

FIG. 3 is a drawing which shows how certain components cooperate in combination to cancel out thermal expansion effects.

DETAILED DESCRIPTION OF THE INVENTION

Figure 2:
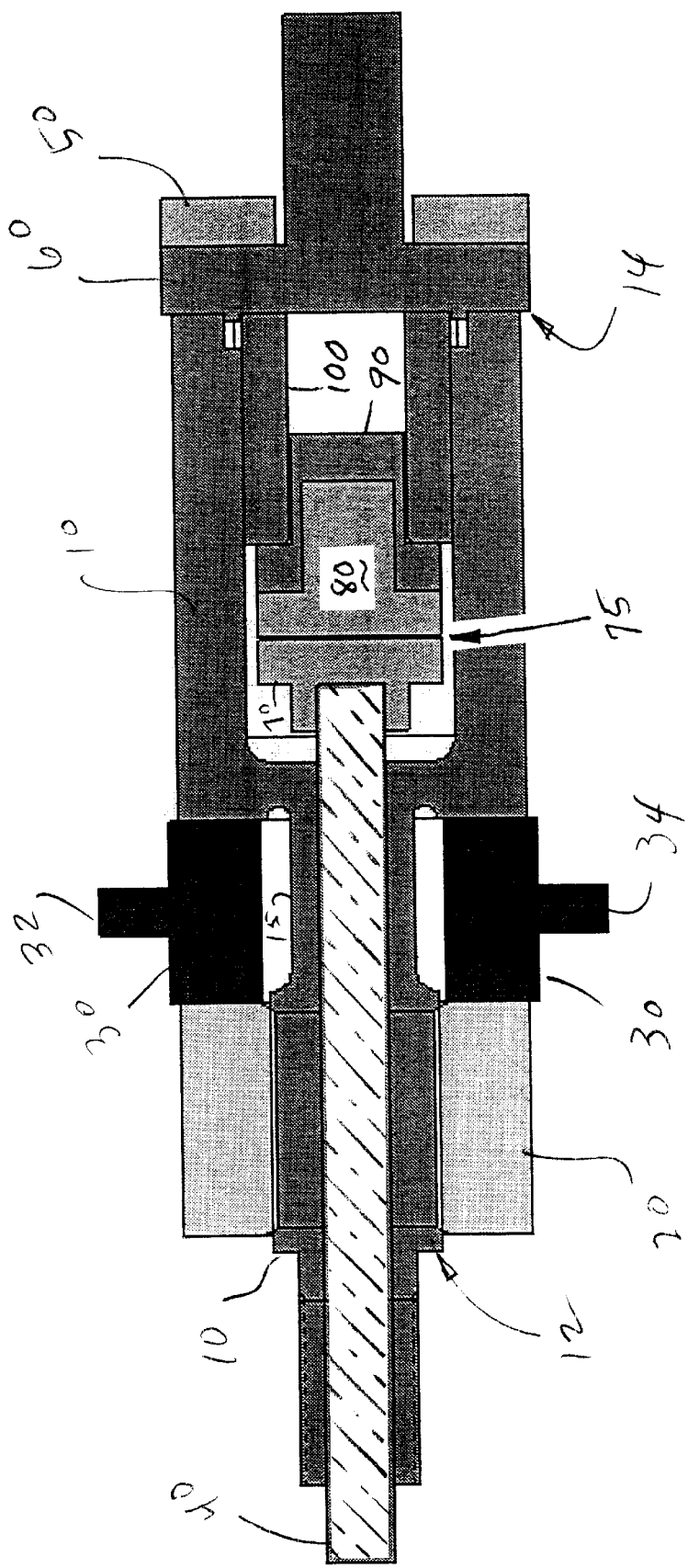
FIG. 2 is a drawing of the preferred embodiment in partial cross-section.

FIG. 2 is a drawing which shows a preferred embodiment of the invention in partial cross-section. One advantage of the design is that the entire unit requires only ten unique parts, two of which are external to the motor assembly. Also, as compared to previous designs, the number of internal moving parts has been reduced to five. Invar 36 is only used on three of the parts, and external threads are only used on one part.

The motor includes a solid housing in the form of force tube 10 onto which there is journaled a force motor PZT cylinder 30 and nut 20, both preferably constructed of Invar-36. At the other end of the assembly, a force tube cap 60 is attached to the tube 10 along with a lappable U-spacer 50. This construction establishes mating reference surfaces 12 and 14.

Among the improvement of the invention, a central structural member 15 is stretched by the piezoelectric element 30, thereby enhancing overall rigidity and robustness. This central stretching removes the PZT element from the load path of the motor when the motor is relaxed, thereby preventing damage to the piezoelectric element during assembly, or during launch into space. When the piezoelectric element is powered through electrodes 32, 34, central structural member 15 also improves the failure strength of the assembly to further increase the robustness of the motor design.

Figure 1A:
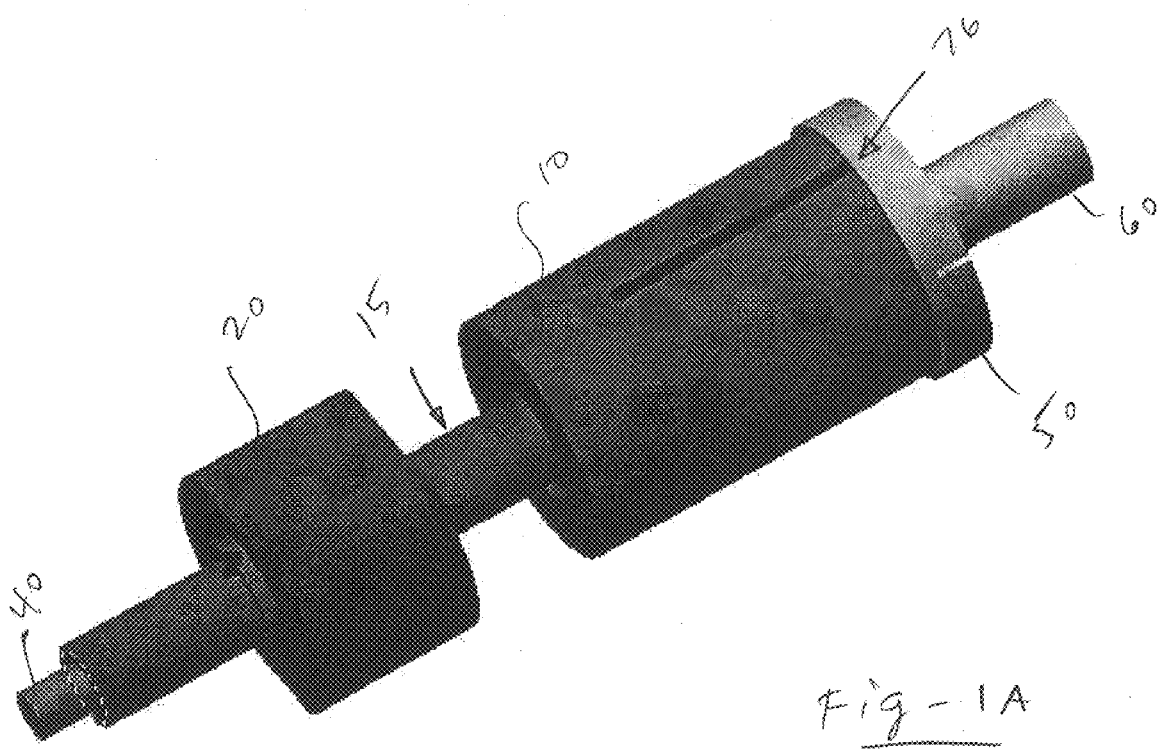
FIG. 1A is a computer-generated, oblique view of an improved force motor according to the invention without the PZT cylinder.
Figure 1B:
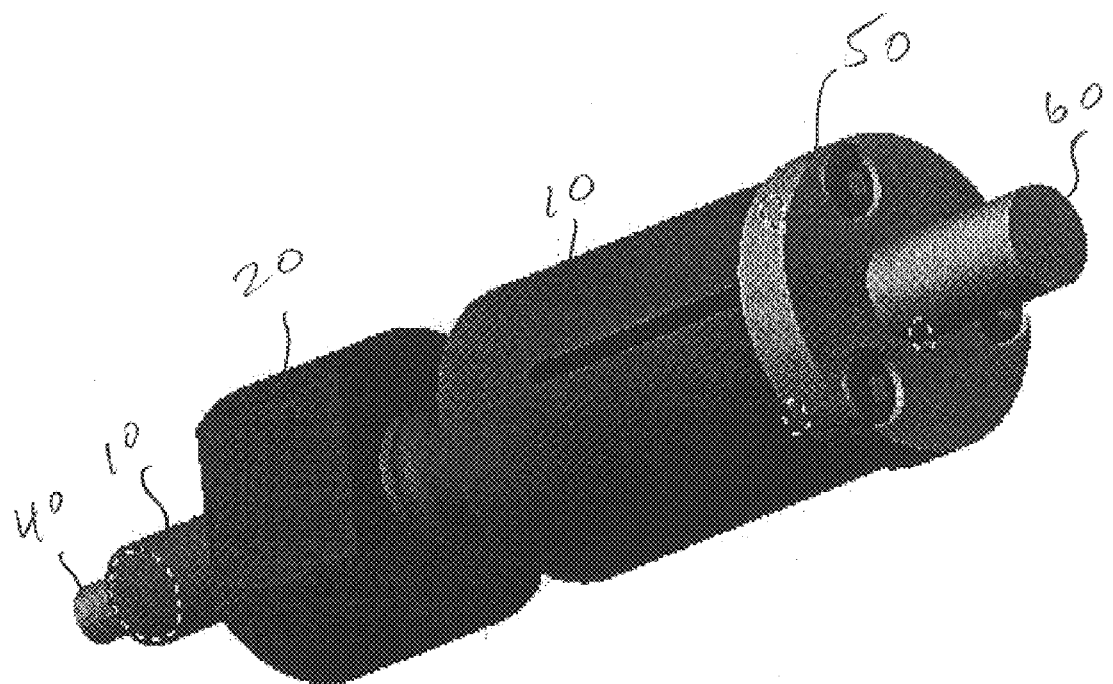
FIG. 1B is a computer-generated, oblique view of the improved force motor of FIG. 1A without the PZT cylinder, viewed from a different perspective.

FIG. 1A is a computer-generated, oblique view of the preferred embodiment of the invention without the PZT cylinder. FIG. 1B is a computer-generated drawing of the motor seen from a different perspective. Within the body of the motor, there are disposed a number of components which cooperate to achieve a temperature expansion coefficient that approaches zero. In particular, quartz rod 40 fits into a small nail cap plate 70 which faces a large nail cap plate 80. The large nail cap 80 fits into a large nail cup 90 which, in turn, is fitted into a tube 100. The bottom part of the large nail cap 80 seats against the interior bottom of the cup 90, and is joined with a 2-mm screw (not shown). The underside of the lip of the cup 90 seats against the rim of the tube 100.

FIG. 3 is a drawing which helps to explain the way in which the half plates, cup and other components cooperate to provide an overall coefficient of thermal expansion of near zero. As the quartz rod 40 and caps 70 and 80 expand, the gap 75 closes. However, the cup 90, fabricated from aluminum (6061-T6) expands in the opposite direction, thereby opening the gap and canceling out the affect due to the rod/caps expansion.

The caps 70, 80 are preferably fabricated from Invar-36, whereas the tube 100 is preferably fabricated from Zerodur® or other material exhibiting a relatively low coefficient of thermal expansion, such as SFL-6 glass. Zerodur® is a glass ceramic developed by Schott Research Labs which exhibits an extremely low thermal expansion of $\pm 0.10 \times 10^{-6\circ}$ C. Invar, an alloy steel with about ⅓ nickel, also exhibits an extremely low coefficient of thermal expansion.

A capacitor is disposed in the gap 75, with leads emerging through slot(s) 76. The capacitance is compared to a reference capacitance (not shown) and when the a desired correlation is realized, the rod 40 is locked into position with one or more set screws (also not shown). The capacitances are configured into an electrical bridge such that as the capacitance of the gap capacitor changes, the signal to the PZT element is change to offset temperature fluctuations.

The invention also has the advantage that the capacitance of the feedback system can be changed after the motor has been assembled. This allows the nominal capacitance to be optimized and standardized for the nominal controller capacitance. This improves the manufacturability in that this is no longer a single point failure mechanism in the assembly.

The improved motor finds applicability in various commercial products, including scientific etalons, nanopositioning systems, custom fiber optic assemblies, and custom CCD detectors. One specific application is the etalon system associated with the GroundWinds Hawaii project, which requires two systems of the type described herein, but with differing gaps. However, using the instant invention, the gap of the etalon can be changed from 50 microns to 15 cm without changing the fundamental design. The standard etalon plate size for the GroundWinds system is 60 mm, with a clear aperture of 58 mm. The plate size according to the invention may be modified to accommodate any clear aperture from 10 mm to 90 mm through the use of extenders added to the motor to accommodate greater gaps. Different cups may also be installed to compensate for longer etalon designs.

We claim:

1. An improved piezoelectric (PZT) force motor, comprising:
   a housing having opposing ends;
   a PZT element concentrically supported about a portion of the housing, said PZT element being operative to expand and contract the ends of the housing through the application of an electric signal; and
   a plurality of components in series within the housing exhibiting both positive and negative coefficients of thermal expansion which cooperate to cancel one another so as to reduce the overall temperature expansion coefficient of the motor.

2. The improved piezoelectric force motor of claim 1, wherein the PZT element is a stacked structure.

3. The improved piezoelectric force motor of claim 1, wherein the components include:
   a first member which expands in one direction; and
   a second member which expands in the opposite direction.

4. The improved piezoelectric force motor of claim 3, wherein the second member is a cup.

* * * * *